United States Patent
Huber

(10) Patent No.: US 7,586,352 B2
(45) Date of Patent: Sep. 8, 2009

(54) CONVERTER HAVING A TIME-DELAY CIRCUIT FOR PWM SIGNALS

(75) Inventor: Norbert Huber, Teisendorf (DE)

(73) Assignee: Dr. Johannes Heidenhain GmbH, Traunreut (DE)

( * ) Notice: Subject to any disclaimer, the term of this patent is extended or adjusted under 35 U.S.C. 154(b) by 108 days.

(21) Appl. No.: 11/957,945

(22) Filed: Dec. 17, 2007

(65) Prior Publication Data

US 2008/0150604 A1    Jun. 26, 2008

(30) Foreign Application Priority Data

Dec. 22, 2006    (DE) .................. 10 2006 060 828

(51) Int. Cl.
*H03H 11/26*    (2006.01)
(52) U.S. Cl. .................. 327/290; 327/268; 327/283
(58) Field of Classification Search .................. 327/108, 327/111, 261, 268, 271, 277, 283, 284, 290
See application file for complete search history.

(56) References Cited

U.S. PATENT DOCUMENTS

| 4,204,242 | A | * | 5/1980 | Metzner | 361/198 |
| 4,430,587 | A | * | 2/1984 | Tennyson | 327/281 |
| 5,028,823 | A | * | 7/1991 | Watanabe | 327/126 |
| 7,518,429 | B2 | * | 4/2009 | Liu et al. | 327/261 |

FOREIGN PATENT DOCUMENTS

DE    10 2005 020 805    11/2006

* cited by examiner

*Primary Examiner*—Lincoln Donovan
*Assistant Examiner*—Hai L Nguyen
(74) *Attorney, Agent, or Firm*—Kenyon & Kenyon LLP

(57) ABSTRACT

A converter includes a time-delay circuit for a PWM signal, applied to input of the time-delay circuit, by which rising edges of the PWM signal are delayed by an ON delay and falling edges of the PWM signal are delayed by an OFF delay, in order to form a drive signal, available at the output of the time-delay circuit, for a semiconductor switch element. The time-delay circuit includes two resistors, two capacitors, a diode and a comparator, and is therefore particularly easy to implement.

11 Claims, 4 Drawing Sheets

CONVERTER HAVING A TIME-DELAY CIRCUIT FOR PWM SIGNALS

CROSS-REFERENCE TO RELATED APPLICATIONS

The present application claims priority to Application No. 10 2006 060 828.3, filed in the Federal Republic of Germany on Dec. 22, 2006, which is expressly incorporated herein in its entirety by reference thereto.

FIELD OF THE INVENTION

The present invention relates to a converter having a time-delay circuit for PWM signals. For example, such converters are used widely in the field of drive engineering to supply electric motors with current.

BACKGROUND INFORMATION

To supply an electric motor with current, it is conventional, with the aid of a half-bridge circuit, to convert the direct voltage available in an intermediate circuit into alternating current for the individual motor phases. To that end, for each motor phase, a half-bridge circuit is needed, with whose two semiconductor switch elements the motor phase is switched alternately to the positive or negative conductor bar of the intermediate circuit. In this context, usually the pulse-width modulation method (PWM method) is used, in which a PWM signal is conditioned such that the two semiconductor switch elements are able to be driven.

German Published Patent Application No. 10 2005 020 805 describes such a half-bridge circuit operated according to the PWM method, and explains that when switching between the two semiconductor switch elements, it is important to adhere to a locking time or block time during which both semiconductor switch elements are turned off and therefore are non-conductive, since otherwise there is a possibility of a short-circuit between the positive and negative conductor bar. German Published Patent Application No. 10 2005 020 805 also describes how such a block time is able to be produced. The delay of rising edges of the PWM signals ensures that a block time is observed. According to at least one arrangement, the falling edges of the PWM signals are also delayed, and specifically by an OFF delay (td1) which is smaller than the ON delay (te1+td1) of the rising edges. The block time is then the difference of the two delay times.

SUMMARY

Example embodiments of the present invention provide a simplified a time-delay circuit, with which an ON delay may be brought about for rising edges, and an OFF delay may be brought about for falling edges of a PWM signal.

The time-delay circuit includes a first capacitor whose state of charge determines the voltage level at the input of a comparator. If a PWM signal at the input of the time-delay circuit switches from a low level to a high level, then the first capacitor is charged via a series connection of a first and a second resistor. This second resistor is bypassed via a diode, connected in parallel to the second resistor, when the first capacitor is discharged after a change of the PWM signal from a high level to a low level. Therefore, the capacitor is discharged faster than it is charged.

Since the state of charge of the capacitor determines the voltage level at the input of the comparator, and it switches its output from a low level to a high level when a switch-on level is exceeded, and switches its output from a high level to a low level in response to a drop below a switch-off level, rising and falling switching edges of the PWM signal may be delayed differently. The rising edges are delayed with an ON delay that is greater than an OFF delay with which the falling edges of the PWM signal are delayed.

The block time for which two semiconductor switch elements of a half-bridge are turned off simultaneously corresponds to the difference between the ON delay and the OFF delay.

The time-delay circuit described also provides that the signals used for switching the semiconductor switches do not drop below a minimum pulse duration corresponding to the OFF delay. Negative effects resulting from ON durations of the semiconductor switch elements which are too short may thus be avoided. For example, the result of such ON durations which are too short may be that a chopping behavior of the current will occur in free-wheeling diodes that are connected in parallel to the semiconductor switch elements, which means that the current changes very quickly, and high voltages, which are able to destroy the power semiconductors involved, are induced via existing leakage inductances.

According to an example embodiment of the present invention, a converter includes a time-delay circuit having an input configured to receive a PWM signal. The time delay circuit is configured to delay rising edges of the PWM signal by an ON delay and to delay falling edges of the PWM signal by an OFF delay to form a drive signal available at an output of the time-delay circuit for a semiconductor switch element. The input is connected, via a series connection of a first resistor and a second resistor, to a first terminal of a first capacitor, and a second terminal of the first capacitor is constantly at a low level. The first terminal of the first capacitor is connected to an input of a comparator. An output of the comparator is configured to form the output of the time-delay circuit. The output is configured to change between a high level and a low level as a function of a voltage level at the input of the comparator, and the voltage level at the input of the comparator is a function of a state of charge of the first capacitor. A diode is connected in parallel to the second resistor. The first resistor and the second resistor are configured to limit a charging current for the first capacitor in response to a change from a low level to a high level at the input of the time-delay circuit, and only the first resistor is configured to limit a discharging current for the first capacitor upon a change from a high level to a low level at the input of the time-delay circuit.

The time-delay circuit may include a second capacitor connected between the input of the comparator and the output of the comparator.

The time-delay circuit may include a second capacitor connected in parallel between the input of the comparator and the output of the comparator.

The ON delay may be greater than the OFF delay.

A switch-on level of the comparator may be between the low level and the high level, and a switch-off level of the comparator may be between the low level and the switch-on level.

Further features and aspects of example embodiments of the present invention are described in more detail below with reference to the appended Figures.

DETAILED DESCRIPTION

Figure 1:
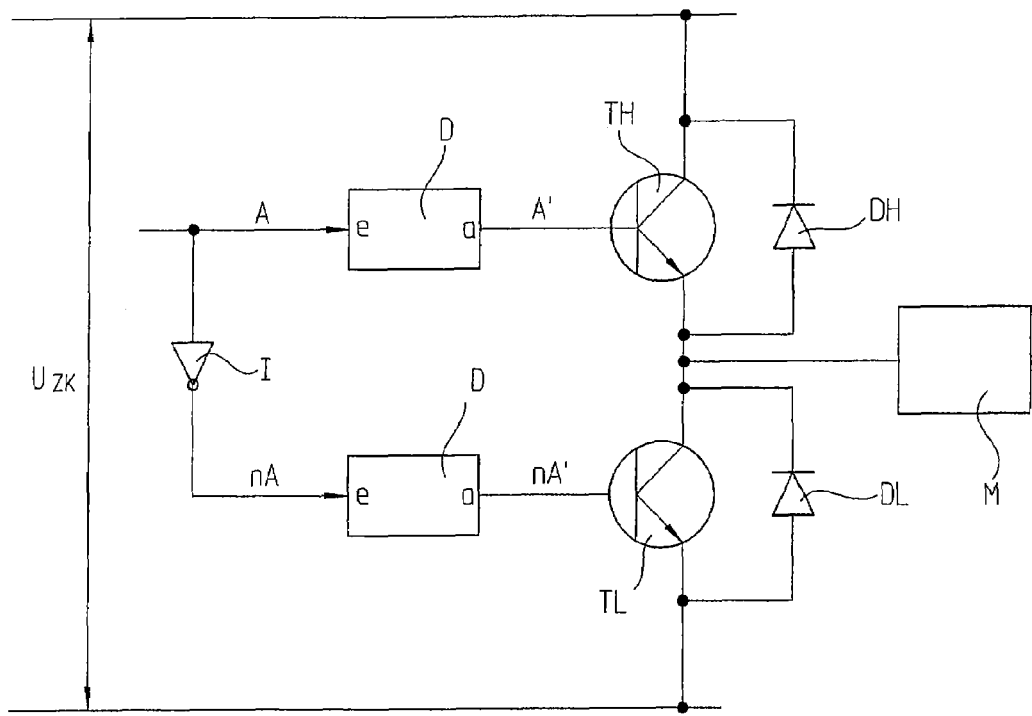
FIG. 1 schematically illustrates a half-bridge in a converter

FIG. 1 schematically illustrates a section of a converter. An intermediate circuit provides a direct voltage $U_{ZK}$. A phase of a motor M (or more generally: of a load) is switched alternately to the positive and negative potential of the intermediate circuit with the aid of a half-bridge circuit. In this context, the half-bridge circuit includes two semiconductor switch elements TH, TL which are alternately conductive or non-conductive, and under no circumstances may both be conductive. For example, these semiconductor switch elements TH, TL are IGBTs or power MOSFETs. Free-wheeling diodes DH, DL are connected in parallel to semiconductor switch elements TH, TL. Because of the inductance of the load, by turning off the load current, a voltage is induced which counteracts the turn-off. The resulting currents are routed through free-wheeling diodes DH, DL via the intermediate circuit.

To drive a three-phase motor, three half-bridges are needed.

The driving of a half-bridge, thus the switching of semiconductor switch elements TH, TL is explained below. A digital PWM signal A, thus a PWM signal A alternating between a high level and a low level, is applied to the half-bridge. In this context, the pulse duty factor of A corresponds to the voltage which is to be available at the phase of motor M. Thus, given a pulse duty factor of 0.5, the phase is precisely between the positive and negative potential of the intermediate circuit, thus at 0 V. With a pulse duty factor between 0 and 1, any voltage between the negative and positive potential of the intermediate circuit may thus be obtained at the phase of motor M.

Since the two semiconductor switch elements TH, TL (except for the observance of the block time) must be switched in opposition, a PWM signal nA inverse to A is generated from PWM signal A by an inverter I. Both A and nA pass through respective time-delay circuits D, which generate digital signals A' and nA', respectively, and whose functionality is described in greater detail below. This time-delay circuit D provides for the adherence to the block time. The block time is the time interval between the turning off of the one semiconductor switch element (TH or TL) and the turning on of the other semiconductor switch element (TL or TH) and, for example, amounts to 2 μs.

Time-delay circuit D delays rising edges of A or nA by a specific time referred to as an ON delay. Falling edges are delayed by a specific time, referred to as an OFF delay. The OFF delay is somewhat shorter than the ON delay.

Still further circuits may be located between time-delay circuit D and respective semiconductor switch element TH, TL, such as driver circuits or a logic which transmits PWM signals A', nA' to semiconductor switch elements TH, TL only when a pulse enable is present. To that end, a logic enable signal is ANDed to respective PWM signal A', nA'. If no enable is present, both semiconductor switch elements are non-conductive.

Figure 2:
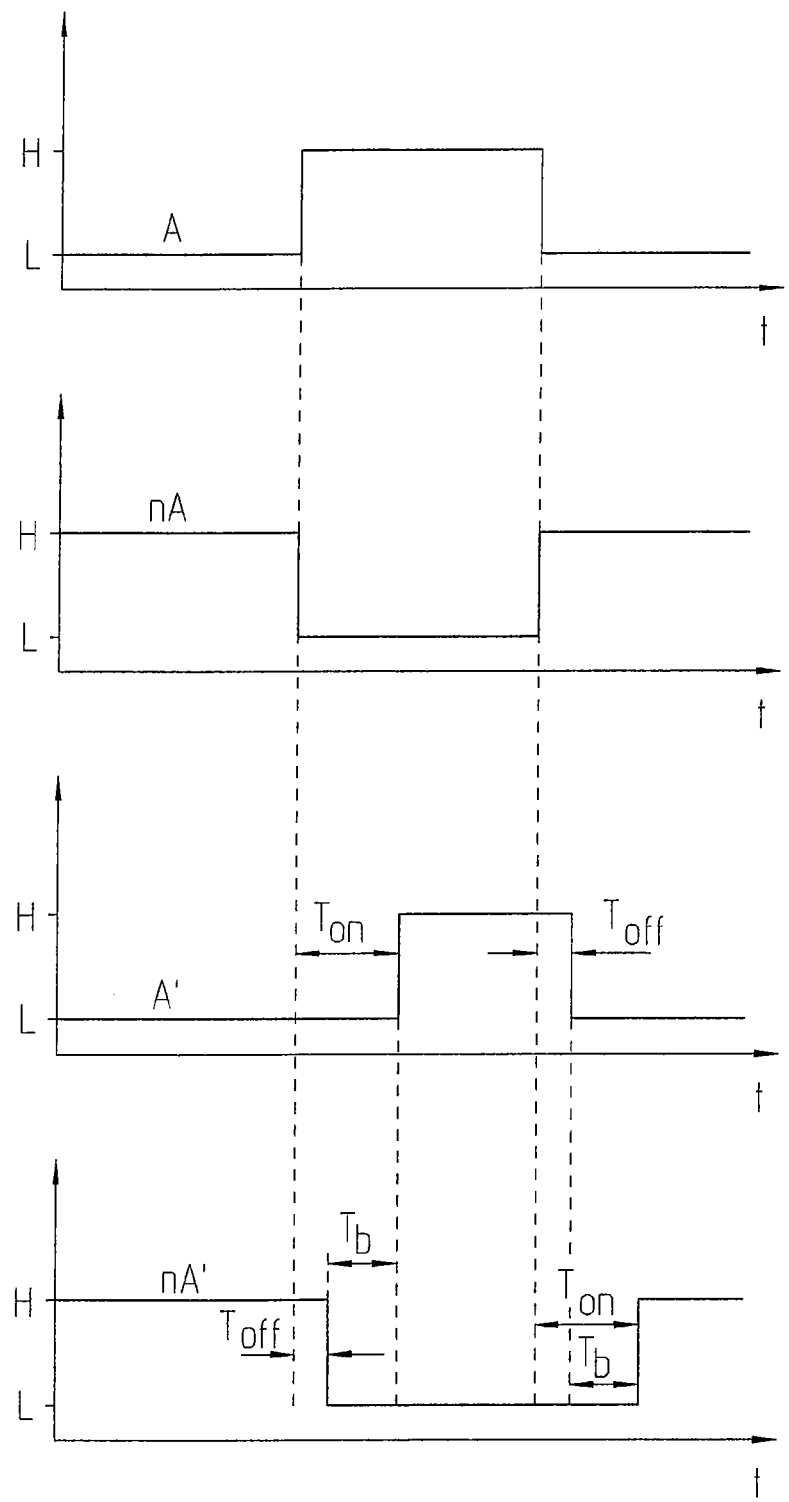
FIG. 2 schematically illustrates PWM signals for driving a half-bridge.

FIG. 2 schematically illustrates the above-mentioned PWM signals A, nA, A', nA' in the time characteristic for a PWM pulse in signal A.

Signal nA corresponds to signal A inverted in inverter I.

A' is obtained by delaying rising edges of A (thus a change from a low level L to a high level H) by an ON delay $T_{on}$, and delaying falling edges of A (thus a change from a high level H to a low level L) by an OFF delay $T_{off}$.

Signal nA' is obtained by delaying rising edges of nA by an ON delay $T_{on}$, and delaying falling edges of nA by an OFF delay $T_{off}$. This means that nA' does not represent an inversion of A', but rather signal nA altered by time-delay circuit D.

In the comparison of signals A' and nA', which are ultimately utilized for driving semiconductor switch elements TH, TL, it is seen that a block time of $Tb=T_{on}-T_{off}$ is maintained. Typical values for $T_{on}$ are, e.g., 2.5 μs and for $T_{off}$ are, e.g., 0.5 μs, whereby the above-mentioned block time of 2 μs is obtained.

Figure 3:
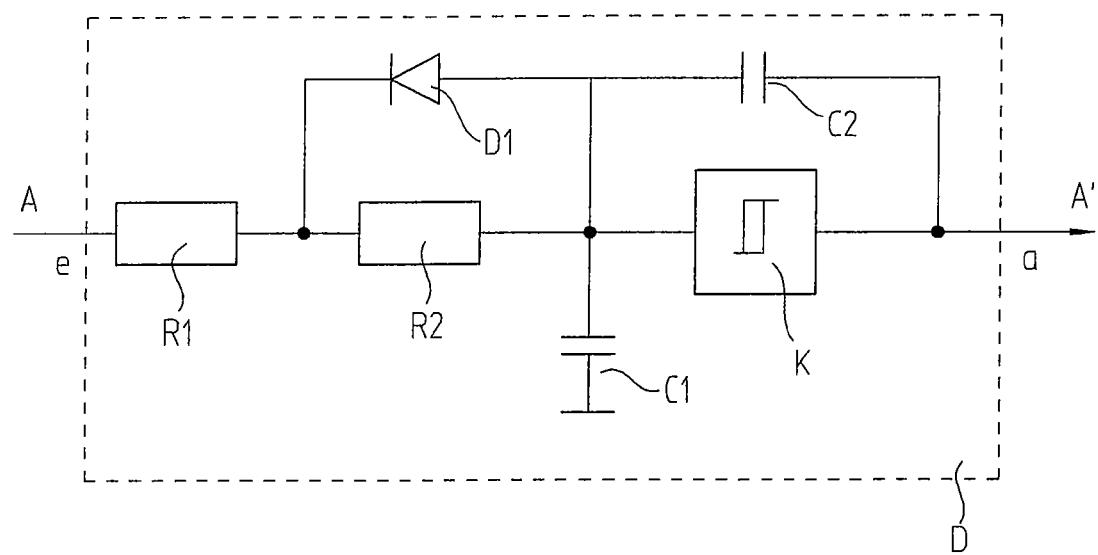
FIG. 3 schematically illustrates a time-delay circuit for PWM signals.

FIG. 3 schematically illustrates time-delay circuit D, which is present twice per half-bridge, since driving signals A' and nA', respectively, used for driving each semiconductor switch element TH, TL originate from respective time-delay circuits. Thus, six such time-delay circuits D are necessary to operate a three-phase motor M.

PWM signal A, which is still undelayed, is applied to input e of time-delay circuit D. Signal A arrives, via a series connection of a first resistor R1 and a second resistor R2, at a first terminal of a capacitor C1, whose second terminal is permanently at a low level. In addition, the first terminal of capacitor C1 is connected to an input of a comparator K, whose output forms output a of a time-delay circuit D. The output of comparator K, and therefore output a of time-delay circuit D, is at a low level or a high level depending on the voltage level at the input of comparator K.

A diode D1 is connected in parallel to second resistor R2 such that, in response to a change from a low level L to a high level H at input e of time-delay circuit D, the second resistor R2, together with first resistor R1, limits a charging current for first capacitor C1, while its discharging current is limited only by first resistor R1 upon a change from a high level H to a low level L at input e. This is provided if, given a high level H at input e and a low level at the input of comparator K, diode D1 blocks, and when the level conditions are reversed (thus, in the case of charged capacitor C1 and a low level L at input e), diode D1 conducts and short-circuits second resistor R2.

A second capacitor C2 is connected in parallel to comparator K, thus between the input and output of comparator K. The function of second capacitor C2 is explained in detail with reference to FIG. 4.

Figure 4A:
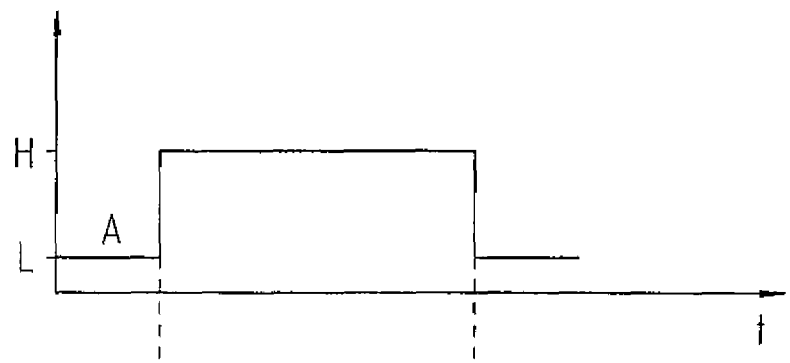
FIG. 4a to 4c are schematic signal and potential diagrams.

FIG. 4a schematically illustrates a signal A which is applied to input e of time-delay circuit D. It includes only one rising and falling edge.

Figure 4B:
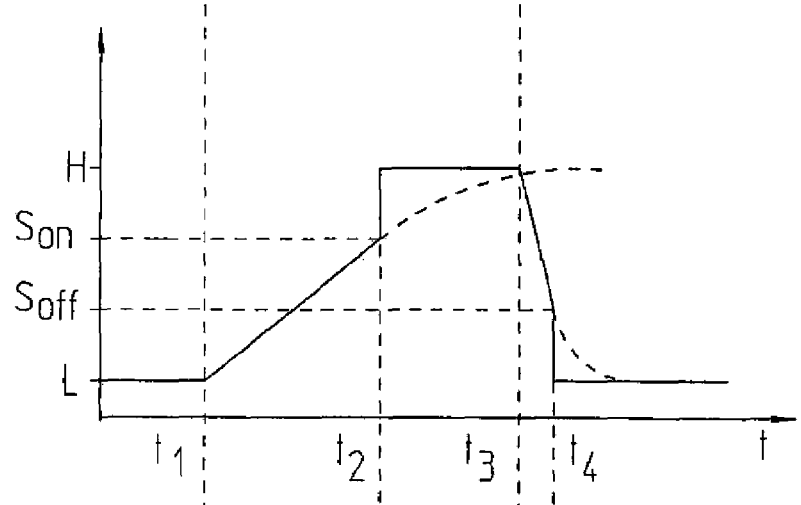

FIG. 4b schematically illustrates the voltage characteristic at the input of comparator K, together with switch-on level $S_{on}$ and switch-off level $S_{off}$ of comparator K.

Figure 4C:
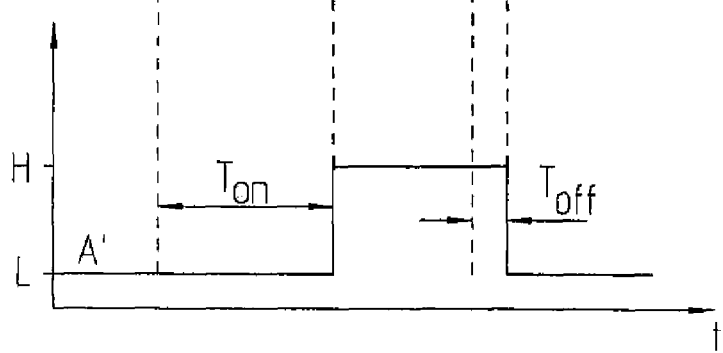

FIG. 4c schematically illustrates resulting signal A' at output a of time-delay circuit D.

At instant $t_1$, signal A changes from a low level L to a high level H. As of this instant $t_1$, capacitor C1 and capacitor C2 are charged via first and second resistors R1 and R2. Therefore, the voltage at the input of comparator K increases. At an instant $t_2$, switch-on level $S_{on}$ of comparator K is reached, whose output at this moment switches from a low level L to a high level H. Since the output of comparator K is at the same time output a of time-delay circuit D, at this moment, A' also switches to a high level H, later by an ON delay $T_{on}$ ($T_{on}=t_2-t_1$) compared to signal A. Time $T_{on}$ is thus the charging time of first and second capacitors C1 and C2 until reaching switch-on level $S_{on}$, and this time is determined by the series connection of the two resistors R1 and R2 which limits the charging current.

Without second capacitor C2, after instant $t_2$, the level at the input of comparator K would follow the dashed line and approach high level H. If signal A were to fall again to a low level L before the full high level H would be present at the input of comparator K, then the time until reaching switch-off level $S_{off}$ at instant $t_3$, and therefore OFF delay $T_{off}$ would not be clearly defined. That is, the discharge of capacitor C1 would then start from a lower level.

Since OFF delay $T_{off}$ also defines the switching pulse having the shortest ON duration of associated semiconductor switch element TH, TL, a shortened OFF delay may lead to PWM pulses which are so short that, as mentioned above, semiconductor switch elements TH, TL are in danger of being destroyed.

This problem is avoided due to second capacitor C2. Since capacitor C2 at the output of the comparator is shifted to a high level H, the charge stored in capacitor C2 up to instant $t_2$ is available for the complete charging of first capacitor C1. That is why, as illustrated in FIG. 4b, the jump to high level H at the input of comparator K after $t_2$ takes place virtually without time delay. A falling edge in signal A following instant $t_2$ is therefore always delayed by full OFF delay $T_{off}$. A minimal ON duration of associated semiconductor switch element TH, TL is thus always maintained.

At instant $t_3$, signal A jumps back to low level L. Capacitor C1 is discharged via R1, since resistor R2 is bridged by diode D1 during the discharging. The discharging process is therefore considerably faster than the charging process. The time until reaching switch-off level $S_{off}$ of comparator K at instant $t_4$, and therefore OFF delay $T_{off}$ ($T_{off}$=t4−t3) is therefore correspondingly shorter than ON delay $T_{on}$. The (shorter) OFF delay $T_{off}$ and (longer) ON delay $T_{on}$ may thus be determined by a suitable selection of resistors R1 and R2 and capacitors C1 and C2.

Second capacitor C2 also provides at instant $t_4$ that the level at the input of comparator K falls virtually immediately to low level L, so that comparator K is ready for the next rising edge of A.

Values for the dimensioning of the components of time-delay circuit D may be, for example:

R1=2 kΩ
R2=2.5 kΩ
C1=300 pF
C2=150 pF

For the delay times, it holds approximately that:

$$T_{on}=(R1+R2)*(C1+C2)$$

$$T_{off}=R1*(C1+C2)$$

What is claimed is:

1. A converter, comprising:
a time-delay circuit having an input configured to receive a PWM signal, the time delay circuit configured to delay rising edges of the PWM signal by an ON delay and to delay falling edges of the PWM signal by an OFF delay to form a drive signal available at an output of the time-delay circuit for a semiconductor switch element;
wherein the input is connected, via a series connection of a first resistor and a second resistor, to a first terminal of a first capacitor, a second terminal of the first capacitor constantly at a low level;
wherein the first terminal of the first capacitor is connected to an input of a comparator, an output of the comparator configured to form the output of the time-delay circuit, the output configured to change between a high level and a low level as a function of a voltage level at the input of the comparator, the voltage level at the input of the comparator being a function of a state of charge of the first capacitor; and
wherein a diode is connected in parallel to the second resistor, the first resistor and the second resistor configured to limit a charging current for the first capacitor in response to a change from a low level to a high level at the input of the time-delay circuit, only the first resistor configured to limit a discharging current for the first capacitor upon a change from a high level to a low level at the input of the time-delay circuit.

2. The converter according to claim 1, wherein the time-delay circuit includes a second capacitor connected between the input of the comparator and the output of the comparator.

3. The converter according to claim 1, wherein the time-delay circuit includes a second capacitor connected in parallel between the input of the comparator and the output of the comparator.

4. The converter according to claim 1, wherein the ON delay is greater than the OFF delay.

5. The converter according to claim 1, wherein a switch-on level of the comparator is between the low level and the high level, and a switch-off level of the comparator is between the low level and the switch-on level.

6. A time delay circuit, comprising:
an input configured to receive a PWM signal;
a series connection of a first resistor and a second resistor;
a first capacitor, the input connected, via the series connection of the first resistor and the second resistor, to a first terminal of the first capacitor, a second terminal of the first capacitor constantly at a low level;
a comparator, the first terminal of the first capacitor connected to an input of the comparator, an output of the comparator configured to form an output of the time-delay circuit, the output configured to change between a high level and a low level as a function of a voltage level at the input of the comparator, the voltage level at the input of the comparator being a function of a state of charge of the first capacitor; and
a diode connected in parallel to the second resistor, the first resistor and the second resistor configured to limit a charging current for the first capacitor in response to a change from a low level to a high level at the input of the time-delay circuit, only the first resistor configured to limit a discharging current for the first capacitor upon a change from a high level to a low level at the input of the time-delay circuit.

7. The time-delay circuit according to claim 6, wherein a switch-on level of the comparator is between the low level and the high level, and a switch-off level of the comparator is between the low level and the switch-on level.

8. The time-delay circuit according to claim 6, further comprising a second capacitor connected between the input of the comparator and the output of the comparator.

9. The time-delay circuit according to claim 6, further comprising a second capacitor connected in parallel between the input of the comparator and the output of the comparator.

10. The time-delay circuit according to claim 6, wherein the time delay circuit is configured to delay rising edges of the PWM signal by an ON delay and to delay falling edges of the PWM signal by an OFF delay to form a drive signal available at the output of the time-delay circuit for a semiconductor switch element.

11. The time-delay circuit according to claim 10, wherein the ON delay is greater than the OFF delay.

* * * * *